United States Patent
Koo (10) Patent No.: US 10,446,240 B2
(45) Date of Patent: Oct. 15, 2019

(54) SEMICONDUCTOR DEVICE AND METHOD OF OPERATING THE SAME

(71) Applicant: SK hynix Inc., Gyeonggi-do (KR)

(72) Inventor: Ki-Bong Koo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/864,125

(22) Filed: Jan. 8, 2018

(65) Prior Publication Data

US 2018/0350442 A1    Dec. 6, 2018

(30) Foreign Application Priority Data

Jun. 2, 2017   (KR) ........................ 10-2017-0069243

(51) Int. Cl.
| | | |
|---|---|---|
| *G11C 16/32* | (2006.01) | |
| *G11C 16/28* | (2006.01) | |
| *G11C 16/10* | (2006.01) | |
| *G11C 7/10* | (2006.01) | |

(52) U.S. Cl.
CPC ............ *G11C 16/32* (2013.01); *G11C 7/1093* (2013.01); *G11C 16/10* (2013.01); *G11C 16/28* (2013.01)

(58) Field of Classification Search
CPC ..... G11C 16/32; G11C 7/1066; G11C 7/1093; G11C 16/10; G11C 16/28
USPC ............ 365/185.09, 185.17, 185.19, 185.24, 365/185.33, 189.07, 194, 222, 232, 233.1
See application file for complete search history.

(56) References Cited

U.S. PATENT DOCUMENTS

| | | | | |
|---|---|---|---|---|
| 6,807,613 | B1 * | 10/2004 | Keeth | G11C 7/1072 365/189.05 |
| 6,972,585 | B2 * | 12/2005 | Ito | G11C 11/406 324/750.3 |
| 2004/0221098 | A1 * | 11/2004 | Ito | G06F 11/106 711/106 |
| 2005/0141314 | A1 * | 6/2005 | Ito | G11C 11/406 365/222 |

FOREIGN PATENT DOCUMENTS

| | | |
|---|---|---|
| KR | 100522426 | 10/2005 |
| KR | 1020150062472 | 6/2015 |

* cited by examiner

*Primary Examiner* — Harry W Byrne
(74) *Attorney, Agent, or Firm* — IP & T Group LLP (57) ABSTRACT

A semiconductor device may include a mask control circuit suitable for generating a section-masking signal activated during a strobe section, based on at least one strobe signal; a strobe signal input circuit suitable for generating an input control signal toggled during the strobe section, based on the section-masking signal and the strobe signal; and a data signal input circuit suitable for receiving a data signal based on the input control signal.

9 Claims, 4 Drawing Sheets

SEMICONDUCTOR DEVICE AND METHOD OF OPERATING THE SAME

CROSS-REFERENCE TO RELATED APPLICATION

This application claims priority to Korean Patent Application No. 10-2017-0069243, filed on Jun. 2, 2017, the disclosure of which is incorporated herein by reference in its entirety.

TECHNICAL FIELD

Exemplary embodiments of the present disclosure relate to a semiconductor design technique. Particularly, exemplary embodiments relate to a semiconductor device and a method of operating the same.

DISCUSSION OF THE RELATED ART

Generally, a semiconductor device including a synchronous memory device operates in synchronization with a clock signal. However, when a data signal is transmitted from a control device (i.e., a controller) to the semiconductor device, a skew between the data signal and the clock signal is generated, because a difference exists between loading of the data signal and loading of the clock signal In order to reduce the skew between the data signal and the clock signal, the control device transmits a strobe signal along with the data signal when it transmits the data signal to the semiconductor device. When the semiconductor device strobes the data signal using the strobe signal, the skew between the clock signal and the data signal may be minimized, because the strobe signal has the same loading as the data signal.

SUMMARY

Various embodiments are directed to provide a semiconductor device capable of receiving a strobe signal while ignoring a ringing included in the strobe signal.

In an embodiment, a semiconductor device may include a mask control circuit suitable for generating a section-masking signal activated during a strobe section, based on at least one strobe signal; a strobe signal input circuit suitable for generating an input control signal toggled during the strobe section, based on the section-masking signal and the strobe signal; and a data signal input circuit suitable for receiving a data signal based on the input control signal.

The mask control circuit may detect a preamble section and a postamble section of the strobe signal based on the strobe signal, and generate the section-masking signal which is activated during the preamble section, a data input control section, and the postamble section.

The data input control section may include a section between the preamble section and the postamble section.

In another embodiment, a semiconductor device may include a mask control circuit suitable for generating a section-masking signal activated during a strobe section, based on a reference signal and differential strobe signals; a strobe signal input circuit suitable for generating a plurality of input control signals sequentially toggled during the strobe section, based on the section-masking signal and the differential strobe signals; and a data signal input circuit suitable for receiving a plurality of data signals based on the input control signals and the reference signal.

The mask control circuit may include: a first control unit suitable for generating a first masking signal activated during the strobe section, based on the reference signal and the differential strobe signals; and a second control unit suitable for generating the section-masking signal by eliminating a glitch from the first masking signal.

The first control unit may include: a first buffer unit suitable for outputting a first signal by buffering a first strobe signal among the differential strobe signals, based on the reference signal; a second buffer unit suitable for outputting a second signal by buffering a second strobe signal among the differential strobe signals, based on the reference signal; and a section detection unit suitable for detecting a start point of a write preamble section and an end point of a write postamble section based on the first signal and the second signal, and suitable for generating the first masking signal corresponding to a result of the detecting.

The section detection unit may include a logic gate performing a NAND operation on the first signal and the second signal.

The second control unit may include: a glitch elimination unit suitable for generating a second masking signal from which the glitch is eliminated based on the first masking signal; and a section-masking signal generation unit suitable for generating the section-masking signal based on the first masking signal and the second masking signal.

The glitch elimination unit may include a pulse generator.

The section-masking signal generation unit may include an SR latch.

The strobe signal input circuit may include: a first buffer unit suitable for outputting differential signals by buffering the differential strobe signals; a second buffer unit suitable for outputting a first toggling signal corresponding to a first strobe signal among the differential strobe signals, by buffering the differential signals; a third buffer unit suitable for outputting a second toggling signal corresponding to a second strobe signal among the differential strobe signals, by buffering the differential signals; a gating unit suitable for gating the first and second toggling signals based on the section-masking signal and suitable for generating first and second gated toggling signals, which are toggled during the strobe section; and a division unit suitable for generating the input control signals by dividing the first and second gated toggling signals during the strobe section based on the section-masking signal.

The data signal input circuit may include: a buffer unit suitable for outputting a plurality of input data signals by buffering the data signals based on the reference signal; a delay unit suitable for outputting a plurality of delay data signals by delaying the input data signals; and a synchronization unit suitable for synchronizing the delay data signals with the input control signals.

In another embodiment, a method for operating a semiconductor device may include generating a section-masking signal activated during a strobe section from a start point of a write preamble section to an end point of a write postamble section, based on differential strobe signals that include first and second strobe signals; generating a first gated toggling signal corresponding to the first strobe signal, and a second gated toggling signal corresponding to the second strobe signal, during the strobe section based on the section-masking signal; generating a plurality of input control signals by dividing the first and second gated toggling signals during the strobe section based on the section-masking signal; and synchronizing a plurality of data signals with the input control signals.

The generating of the section-masking signal may include: generating a first masking signal activated during the strobe section, based on a reference signal and the differential strobe signals; and generating the section-masking signal by eliminating a glitch from the first masking signal.

the generating of the first masking signal may include: outputting a first signal by buffering the first strobe signal based on the reference signal; outputting a second signal by buffering the second strobe signal based on the reference signal; detecting the start point of the write preamble section and the end point of the write postamble section based on the first signal and the second signal; and generating the first masking signal corresponding to a result of the detecting.

The eliminating of the glitch may include: generating a delay signal by delaying the first masking signal by a preset delay time;

generating a second masking signal from which the glitch is eliminated by performing a logic operation on the first masking signal and the delay signal; and generating the section-masking signal activated based on the first masking signal and deactivated based on the second masking signal.

The preset delay time may be set greater than a width of the glitch.

the generating of the first gated toggling signal and the second gated toggling signal may include: outputting differential signals by buffering the differential strobe signals; outputting a first toggling signal corresponding to the first strobe signal by buffering the differential signals; outputting a second toggling signal corresponding to the second strobe signal by buffering the differential signals; and gating the first and second toggling signals based on the section-masking signal and generating the first and second gated toggling signals, which are toggled during the strobe section.

The strobe section may include the write preamble section, a data input control section, and the write postamble section.

The data input control section may include a section between the write preamble section and the write postamble section.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The terminology used herein is for the purpose of describing particular embodiments only and is not intended to be limiting of the present invention.

As used herein, singular forms may include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereinafter, the various embodiments of the present invention will be described in detail with reference to the attached drawings.

Figure 1:
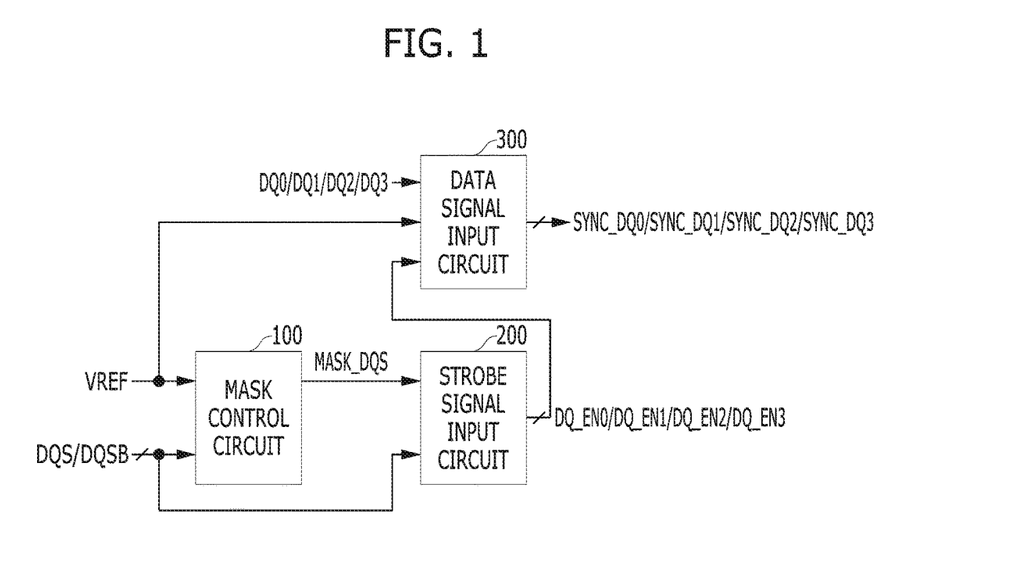
FIG. 1 is a block diagram illustrating a semiconductor device in accordance with an embodiment of the present disclosure.

FIG. 1 is a block diagram illustrating a semiconductor device in accordance with an embodiment of the present invention.

Referring to FIG. 1, the semiconductor device may include a mask control circuit 100, a strobe signal input circuit 200, and a data signal input circuit 300.

The mask control circuit 100 may generate a section-masking signal MASK_DQS activated during a preset strobe section, based on a reference signal VREF and differential strobe signals DQS and DQSB. For example, the mask control circuit 100 may detect a write preamble section tWPRE and a write postamble section tWPST based on the differential strobe signals DQS and DQSB, and may generate the section-masking signal MASK_DQS corresponding to a result of the detection. Here, the section-masking signal MASK_DQS may be activated from a start point of the write preamble section tWPRE to an end point of the write postamble section tWPST. That is, the strobe section may include the write preamble section tWPRE, a data input control section DC, and the write postamble section tWPST. The data input control section DC may include a section between the write preamble section tWPRE and the write postamble section tWPST (refer to FIG. 7).

For reference, a second strobe signal DQSB may start toggling ½ cycle (i.e., 0.5*tCK) earlier than a first strobe signal DQS, and the first strobe signal DQS may finish toggling ½ cycle (i.e., 0.5*tCK) later than the second strobe signal DQSB. In this case, the write preamble section tWPRE may include a section between a first falling edge of the second strobe signal DQSB and a first rising edge of the first strobe signal DQS. For example, the write preamble section tWPRE may correspond to one cycle (i.e., 1*tCK) of the first strobe signal DQS. Also, the write postamble section tWPST may include a section from a final rising edge of the second strobe signal DQSB to a final rising edge of the first strobe signal DQS. For example, the write postamble section tWPST may correspond to ½ cycle (i.e., 0.5 tCK) of the first strobe signal DQS.

The strobe signal input circuit 200 may generate first to fourth input control signals DQ_EN0, DQ_EN1, DQ_EN2 and DQ_EN3, which are sequentially toggled during the strobe section, based on the section-masking signal MASK_DQS and the differential strobe signals DQS and DQSB. However, it is to be noted that in this particular embodiment, the generation of the first to fourth input control signals DQ_EN0, DQ_EN1, DQ_EN2 and DQ_EN3 are shown merely as an example, and that the input control signals are not limited thereto.

The data signal input circuit 300 may receive first to fourth data signals DQ0, DQ1, DQ2 and DQ3 based on the reference signal VREF and the first to fourth input control signals DQ_EN0, DQ_EN1, DQ_EN2 and DQ_EN3, and may generate first to fourth synchronization data signals SYNC_DQ0, SYNC_DQ1, SYNC_DQ2 and SYNC_DQ3. Here, the first to fourth data signals DQ0, DQ1, DQ2 and DQ3 may be data signals sequentially inputted in series according to a burst mode. However, it is to be noted that in this particular embodiment, the input of the first to fourth data signals DQ0, DQ1, DQ2 and DQ3 are shown merely as an example, ant that the data signals are not limited thereto.

Figure 2:
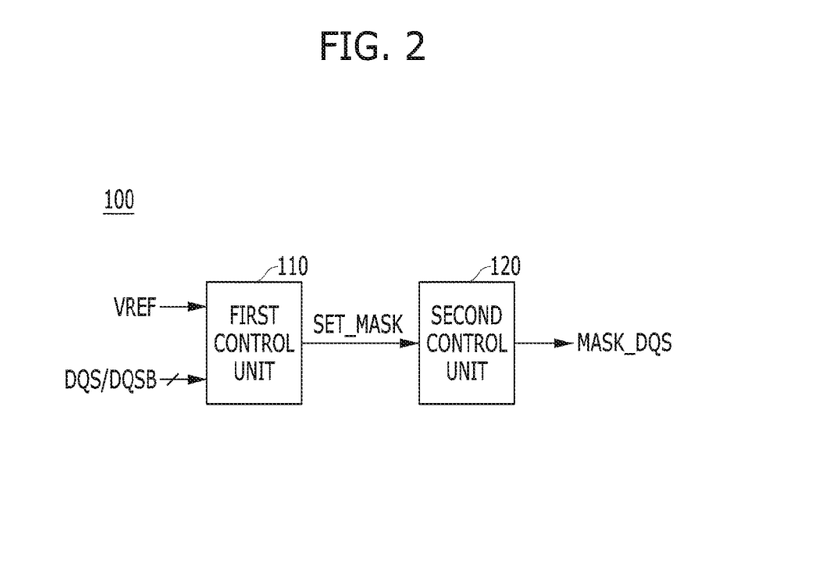
FIG. 2 is a block diagram illustrating a mask control circuit shown in FIG. 1.

FIG. 2 is a block diagram illustrating the mask control circuit 100 shown in FIG. 1.

Referring to FIG. 2, the mask control circuit 100 may include a first control unit 110 and a second control unit 120.

The first control unit 110 may generate a first masking signal SET_MASK activated during the strobe section, based on the reference signal VREF and the differential strobe signals DQS and DQSB.

The second control unit 120 may generate the section-masking signal MASK_DQS by eliminating a glitch from the first masking signal SET_MASK.

Figure 3:
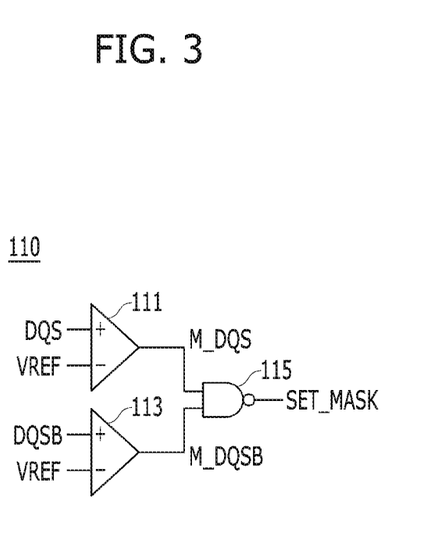
FIG. 3 is a circuit diagram illustrating a first control unit shown in FIG. 2.

FIG. 3 is a circuit diagram illustrating the first control unit 110 shown in FIG. 2.

Referring to FIG. 3, the first control unit 110 may include a first buffer unit 111, a second buffer unit 113, and a section detection unit 115.

The first buffer unit 111 may output a first signal M_DQS by buffering the first strobe signal DQS based on the reference signal VREF. For example, the first buffer unit 111 may include a differential amplifier, which includes a positive input terminal receiving the first strobe signal DQS and a negative input terminal receiving the reference signal VREF.

The second buffer unit 113 may output a second signal M_DQSB by buffering the second strobe signal DQSB based on the reference signal VREF. For example, the second buffer unit 113 may include a differential amplifier, which includes a positive input terminal receiving the second strobe signal DQSB and a negative input terminal receiving the reference signal VREF.

The section detection unit 115 may detect the start point of the write preamble section tWPRE and the end point of the write postamble section tWPST based on the first signal M_DQS and the second signal M_DQSB, and may generate the first masking signal SET_MASK activated during the strobe section from the start point of the write preamble section tWPRE to the end point of the write postamble section tWPST, based on the result of the detection. For example, the section detection unit 115 may include a logic gate performing a NAND operation on the first signal M_DQS and the second signal M_DQSB.

Figure 4:
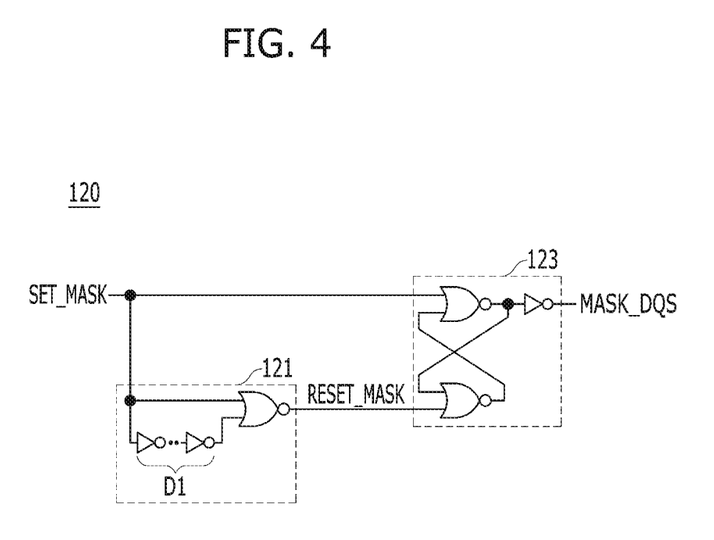
FIG. 4 is a circuit diagram illustrating a second control unit shown in FIG. 2.

FIG. 4 is a circuit diagram illustrating the second control unit 120 shown in FIG. 2.

Referring to FIG. 4, the second control unit 120 may include a glitch elimination unit 121 and a section-masking signal generation unit 123.

The glitch elimination unit 121 may generate a second masking signal RESET_MASK from which the glitch is eliminated based on the first masking signal SET_MASK. For example, the glitch elimination unit 121 may include a pulse generator. For example, the pulse generator may include a delay having a first delay time D1 and a combiner. The delay may include an inverter chain having a plurality of inverters. The combiner may include a logic gate preforming a NOR operation on the first masking signal SET_MASK and an output of the delay. In this case, the first delay time D1 may be set in consideration of the width of the glitch. That is, it is desirable for the first delay time D1 to be set greater than the width of the glitch.

The section-masking signal generation unit 123 may generate the section-masking signal MASK_DQS based on the first masking signal SET_MASK and the second masking signal RESET_MASK. The section-masking signal MASK_DQS may be activated based on the first masking signal SET_MASK, and may be deactivated based on the second masking signal RESET_MASK. For example, the section-masking signal generation unit 123 may include an SR latch.

Figure 5:
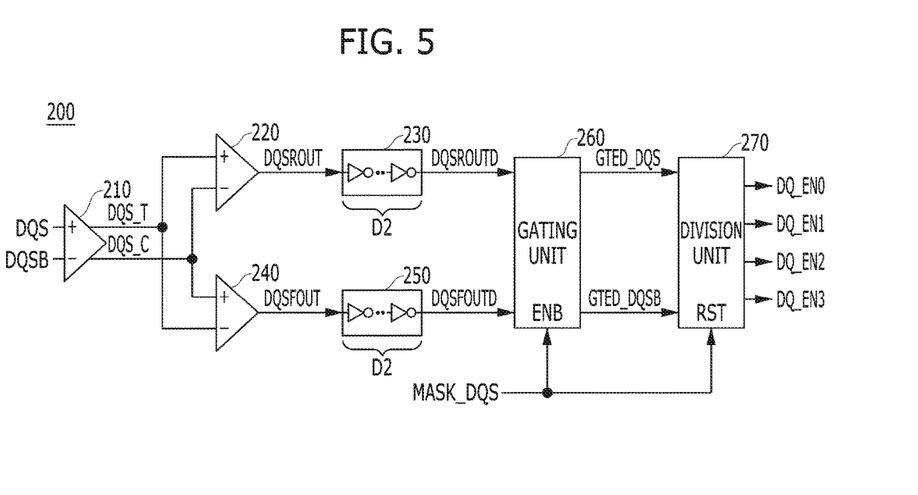
FIG. 5 is a block diagram illustrating a strobe signal input circuit shown in FIG. 1.

FIG. 5 is a block diagram illustrating the strobe signal input circuit 200 shown in FIG. 1.

Referring to FIG. 5, the strobe signal input circuit 200 may include a third buffer unit 210, a fourth buffer unit 220, a first delay unit 230, a fifth buffer unit 240, a second delay unit 250, a gating unit 260, and a division unit 270.

Referring to FIG. 5, the third buffer unit 210 may output differential signals DQS_T and DQS_C by buffering the differential strobe signals DQS and DQSB. For example, the third buffer unit 210 may include a differential amplifier, which includes a positive input terminal receiving the first strobe signal DQS and a negative input terminal receiving the second strobe signal DQSB.

The fourth buffer unit 220 may output a first toggling signal DQSROUT synchronized with the rising edge of the first strobe signal DQS, based on the differential signals DQS_T and DQS_C. For example, the fourth buffer unit 220 may include a differential amplifier, which includes a positive input terminal receiving the signal DQS_T and a negative input terminal receiving the signal DQS_C.

The first delay unit 230 may generate a second toggling signal DQSROUTD by delaying the first toggling signal DQSROUT by a second delay time D2. The second delay time D2 may be set in consideration of the operation time of the second control unit 120, that is, the time taken to generate the section-masking signal MASK_DQS.

The fifth buffer unit 240 may output a third toggling signal DQSFOUT synchronized with the rising edge of the second strobe signal DQSB, based on the differential signals DQS_T and DQS_C. For example, the fifth buffer unit 240 may include a differential amplifier, which includes a positive input terminal receiving the signal DQS_C and a negative input terminal receiving the signal DQS_T.

The second delay unit 250 may generate a fourth toggling signal DQSFOUTD by delaying the third toggling signal DQSFOUT by the second delay time D2.

The gating unit 260 may gate the second and fourth toggling signals DQSROUTD and DQSFOUTD based on the section-masking signal MASK_DQS, and may generate first and second gated toggling signals GTED_DQS and GTED_DQSB, which are toggled during the strobe section.

The division unit 270 may generate the first to fourth input control signals DQ_EN0, DQ_EN1, DQ_EN2, and DQ_EN3 by dividing the first and second gated toggling signals GTED_DQS and GTED_DQSB during the strobe section based on the section-masking signal MASK_DQS. For example, the division unit 270 may generate the first to fourth input control signals DQ_EN0, DQ_EN1, DQ_EN2, and DQ_EN3, which are sequentially activated according to the rising edges of the first and second gated toggling signals GTED_DQS and GTED_DQSB.

Figure 6:
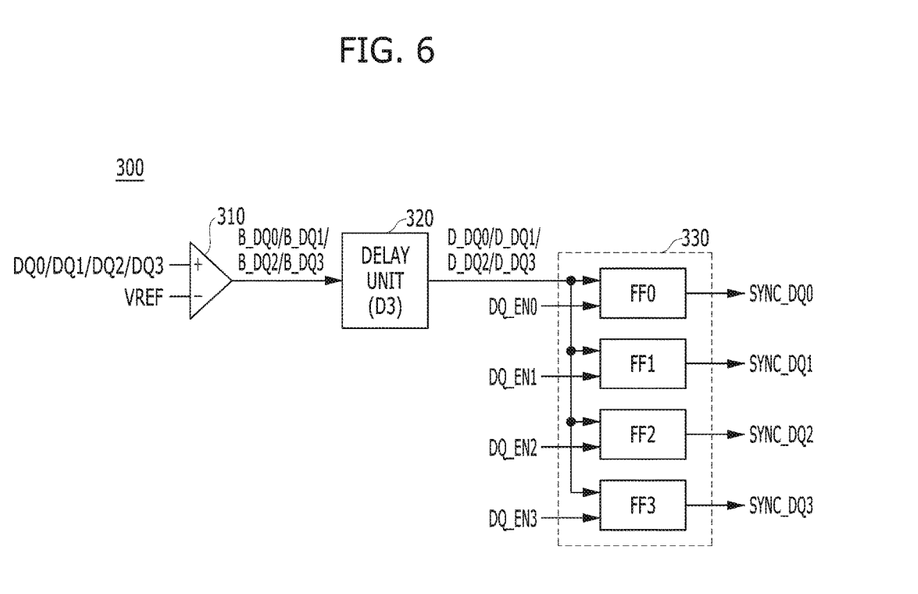
FIG. 6 is a block diagram illustrating a data signal input circuit shown in FIG. 1.

FIG. 6 is a block diagram illustrating the data signal input circuit 300 shown in FIG. 1.

Referring to FIG. 6, the data signal input circuit 300 may include a sixth buffer unit 310, a third delay unit 320, and a synchronization unit 330.

The sixth buffer unit 310 may output first to fourth input data signals B_DQ0, B_DQ1, B_DQ2 and B_DQ3 by buffering the first to fourth data signals DQ0, DQ1, DQ2 and DQ3 based on the reference signal VREF. For example, the sixth buffer unit 310 may include a plurality of differential amplifiers, each including a positive input terminal receiving a corresponding one of the first to fourth data signals DQ0, DQ1, DQ2 and DQ3, and a negative input terminal receiving the reference signal VREF.

The third delay unit 320 may output first to fourth delay data signal D_DQ0, D_DQ1, D_DQ2 and D_DQ3 by delaying the first to fourth input data signals B_DQ0, B_DQ1, B_DQ2 and B_DQ3 by a third delay time D3. The third delay time D3 may be set in consideration of a data setup time, a data hold time, the operation time of the strobe signal input circuit 200, and the like.

The synchronization unit 330 may synchronize the first to fourth delay data signal D_DQ0, D_DQ1, D_DQ2 and D_DQ3 with the first to fourth input control signals DQ_EN0, DQ_EN1, DQ_EN2 and DQ_EN3. For example, the synchronization unit 330 may include first to fourth latches FF0, FF1, FF2 and FF3. The first to fourth latches FF0, FF1, FF2 and FF3 may sequentially latch the first to fourth delay data signals D_DQ0, D_DQ1, D_DQ2 and D_DQ3 based on the first to fourth input control signals DQ_EN0, DQ_EN2 and DQ_EN3, and may generate the first to fourth synchronization data signals SYNC_DQ0, SYNC_DQ1, SYNC_DQ2 and SYNC_DQ3.

Hereinafter, an operation of a semiconductor device according to an embodiment, which is configured as described above, will be described with reference to FIG. 7.

Figure 7:
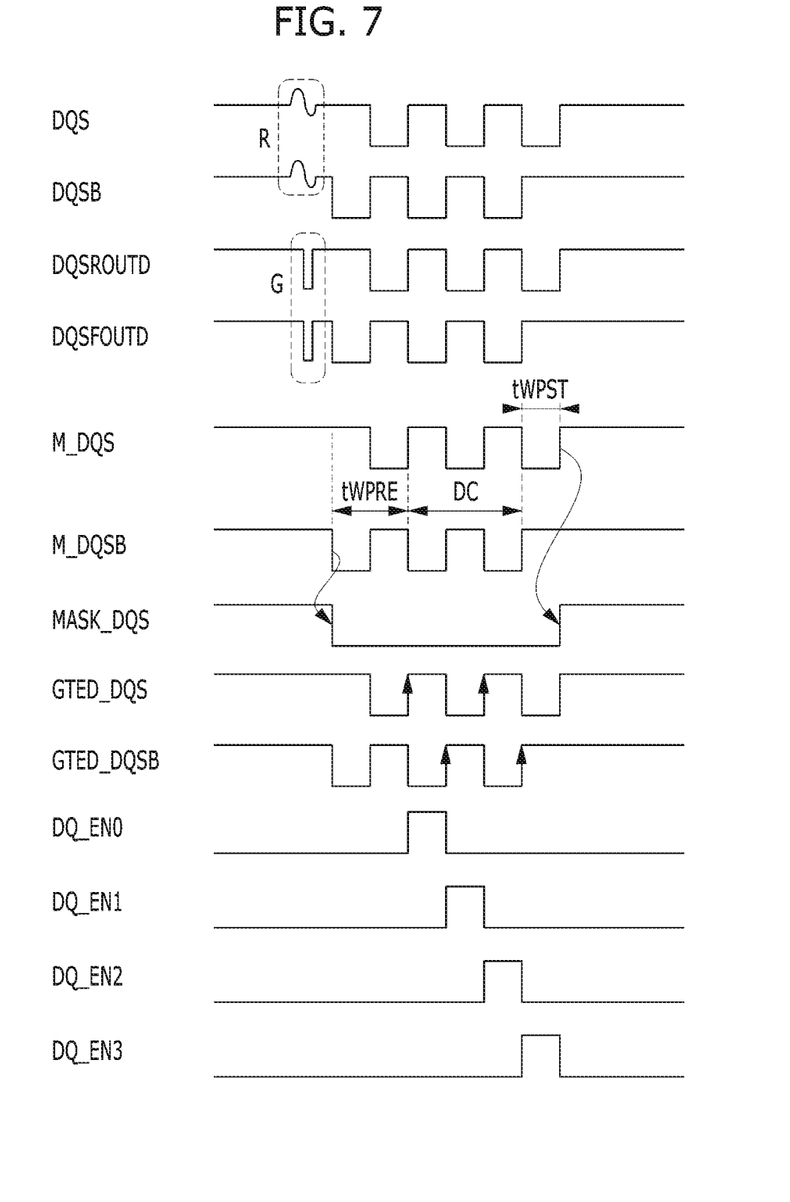
FIG. 7 is a timing diagram describing an operation of the semiconductor device illustrated in FIG. 1.

FIG. 7 is a timing diagram for explaining an operation of the semiconductor device illustrated in FIG. 1. It is noted that the first to third delay times D1, D2 and D3 are not incorporated in FIG. 7 for the convenience of description.

Referring to FIG. 7, the mask control circuit 100 may generate a section-masking signal MASK_DQS activated during a strobe section from a start point of a write preamble section tWPRE to an end point of the write postamble section tWPST, based on differential strobe signals DQS and DQSB. In detail, the first control unit 110 may generate a first masking signal SET_MASK activated during the strobe section on the reference signal VREF and the differential strobe signals DQS and DQSB, and the second control unit 120 may generate the section-masking signal MASK_DQS by eliminating a glitch (not illustrated in the drawing) from the first masking signal SET_MASK. The strobe section may include the write preamble section tWPRE, a data input control section DC, and the write postamble section tWPST. The data input control section DC may include a section between the write preamble section tWPRE and the write postamble section tWPST.

More specifically, the first buffer unit 111 may output a first signal M_DQS by buffering the first strobe signal DQS based on the reference signal VREF. Here, a ringing R may be generated in the first strobe signal DQS shortly before the first strobe signal DQS is toggled, but the ringing R may be ignored by the reference signal VREF. For example, the reference signal VREF may have a voltage level that is about half of the amplitude of the first strobe signal DQS. The reference signal VREF may be changed according to the design. The second buffer unit 113 may output a second signal M_DQSB by buffering the second strobe signal DQSB based on the reference signal VREF. Here, a ringing R may be generated in the second strobe signal DQSB shortly before the second strobe signal DQSB is toggled, but the ringing R may be ignored by the reference signal VREF. The section detection unit 115 may generate a first masking signal SET_MASK based on the first signal M_DQS and the second signal M_DQSB. For example, the section detection unit 115 may generate the first masking signal SET_MASK by performing a NAND operation on the first signal M_DQS and the second signal M_DQSB. Here, a glitch may be generated in the first masking signal SET_MASK due to issues such as the change of the reference signal VREF, signal integrity, and the like.

The glitch elimination unit 121 may generate a second masking signal RESET_MASK from which the glitch is eliminated based on the first masking signal SET_MASK. For example, the glitch elimination unit 121 may generate the second masking signal RESET_MASK from which the glitch is eliminated by performing a NOR operation on the first masking signal SET_MASK and a signal acquired by delaying the first masking signal SET_MASK by the first delay time D1. Desirably, the first delay time D1 may be set greater than the width of the glitch. The section-masking signal generation unit 123 may generate the section-masking signal MASK_DQS based on the first masking signal SET_MASK and the second masking signal RESET_MASK. For example, the section-masking signal generation unit 123 may activate the section-masking signal MASK_DQS based on the first masking signal SET_MASK, and may deactivate the section-masking signal MASK_DQS based on the second masking signal RESET_MASK.

The strobe signal input circuit 200 may generate first to fourth input control signals DQ_EN0, DQ_EN1, DQ_EN2 and DQ_EN3, which are sequentially toggled during the strobe section, based on the section-masking signal MASK_DQS and the differential strobe signals DQS and DQSB.

More specifically, the third buffer unit 210 may output differential signals DQS_T and DQS_C by buffering the differential strobe signals DQS and DQSB. The fourth buffer unit 220 may output a first toggling signal DQSROUT synchronized with the rising edge of the first strobe signal DQS, based on the differential signals DQS_T and DQS_C. The first delay unit 230 may generate a second toggling signal DQSROUTD by delaying the first toggling signal DQSROUT by a second delay time D2. Here, a glitch G may be included in the second toggling signal DQSROUTD because the ringing R included in the first strobe signal DQS is amplified by the third buffer unit 210 and the fourth buffer unit 220. The fifth buffer unit 240 may output a third toggling signal DQSFOUT synchronized with the rising edge of the second strobe signal DQSB, based on the differential signals DQS_T and DQS_C. The second delay unit 250 may generate a fourth toggling signal DQSFOUTD by delaying the third toggling signal DQSFOUT by the second delay time D2. Here, a glitch G may be included in the fourth toggling signal DQSFOUTD because the ringing R included in the second strobe signal DQSB is amplified by the third buffer unit 210 and the fifth buffer unit 240.

The gating unit 260 may gate the second and fourth toggling signals DQSROUTD and DQSFOUTD based on the section-masking signal MASK_DQS, and may generate first and second gated toggling signals GTED_DQS and GTED_DQSB, which are toggled during the strobe section. That is, the gating unit 260 may generate the first and second gated toggling signals GTED_DQS and GTED_DQSB from which the glitch G is eliminated. The division unit 270 may generate first to fourth input control signals DQ_EN0, DQ_EN1, DQ_EN2 and DQ_EN3 by dividing the first and second gated toggling signals GTED_DQS and GTED_DQSB during the strobe section based on the section-masking signal MASK_DQS. For example, the division unit 270 may sequentially generate a first input control signal DQ_EN0 activated according to the first rising edge of the first gated toggling signal GTED_DQS, a second input control signal DQ_EN1 activated according to the second rising edge of the second gated toggling signal GTED_DQSB, a third input control signal DQ_EN2 activated according to the second rising edge of the first gated toggling signal GTED_DQS, and a fourth input control signal DQ_EN3 activated according to the third rising edge of the second gated toggling signal GTED_DQSB.

The data signal input circuit 300 may sequentially receive first to fourth data signals DQ0, DQ1, DQ2 and DQ3 based on the first to fourth input control signals DQ_EN0, DQ_EN1, DQ_EN2 and DQ_EN3. For example, the data signal input circuit 300 may sequentially latch first to fourth delay data signals D_DQ0, D_DQ1, D_DQ2 and D_DQ3 based on the first to fourth input control signals DQ_EN0, DQ_EN1, DQ_EN2 and DQ_EN3, and may generate first to fourth synchronization signals SYNC_DQ0, SYNC_DQ1, SYNC_DQ2 and SYNC_DQ3.

According to an exemplary embodiment as described above, because a section-masking signal for masking differential strobe signals is generated based on the differential strobe signals, it is advantageous in that a domain crossing operation is not necessary, and in that data signals may be synchronized with the differential strobe signals while ignoring a ringing included in the differential strobe signals.

Although various embodiments have been described for illustrative purposes, it will be apparent to those skilled in the art that various changes and modifications may be made without departing from the spirit and scope of the invention as defined in the following claims.

What is claimed is:

1. A semiconductor device, comprising:
a mask control circuit suitable for generating a section-masking signal activated during a strobe section, based on a reference signal and differential strobe signals;
a strobe signal input circuit suitable for generating a plurality of input control signals sequentially toggled during the strobe section, based on the section-masking signal and the differential strobe signals; and
a data signal input circuit suitable for receiving a plurality of data signals based on the input control signals and the reference signal.

2. The semiconductor device of claim 1, wherein the mask control circuit comprises:
a first control unit suitable for generating a first masking signal activated during the strobe section, based on the reference signal and the differential strobe signals; and
a second control unit suitable for generating the section-masking signal by eliminating a glitch from the first masking signal.

3. The semiconductor device of claim 2, wherein the first control unit comprises:
a first buffer unit suitable for outputting a first signal by buffering a first strobe signal among the differential strobe signals, based on the reference signal;
a second buffer unit suitable for outputting a second signal by buffering a second strobe signal among the differential strobe signals, based on the reference signal; and
a section detection unit suitable for detecting a start point of a write preamble section and an end point of a write postamble section based on the first signal and the second signal, and suitable for generating the first masking signal corresponding to a result of the detecting.

4. The semiconductor device of claim 3, wherein the section detection unit comprises a logic gate performing a NAND operation on the first signal and the second signal.

5. The semiconductor device of claim 2, wherein the second control unit comprises:
a glitch elimination unit suitable for generating a second masking signal from which the glitch is eliminated based on the first masking signal; and
a section-masking signal generation unit suitable for generating the section-masking signal based on the first masking signal and the second masking signal.

6. The semiconductor device of claim 5, wherein the glitch elimination unit comprises a pulse generator.

7. The semiconductor device of claim 5, wherein the section-masking signal generation unit comprises an SR latch.

8. The semiconductor device of claim 1, wherein the strobe signal input circuit comprises:
a first buffer unit suitable for outputting differential signals by buffering the differential strobe signals;
a second buffer unit suitable for outputting a first toggling signal corresponding to a first strobe signal among the differential strobe signals, by buffering the differential signals;
a third buffer unit suitable for outputting a second toggling signal corresponding to a second strobe signal among the differential strobe signals, by buffering the differential signals;
a gating unit suitable for gating the first and second toggling signals based on the section-masking signal and suitable for generating first and second gated toggling signals, which are toggled during the strobe section; and
a division unit suitable for generating the input control signals by dividing the first and second gated toggling signals during the strobe section based on the section-masking signal.

9. The semiconductor device of claim 1, wherein the data signal input circuit comprises:
a buffer unit suitable for outputting a plurality of input data signals by buffering the data signals based on the reference signal;

a delay unit suitable for outputting a plurality of delay data signals by delaying the input data signals; and a synchronization unit suitable for synchronizing the delay data signals with the input control signals.

* * * * *